United States Patent [19]

Kurtz et al.

[11] 4,419,620
[45] Dec. 6, 1983

[54] LINEARIZING CIRCUITS FOR A SEMICONDUCTOR PRESSURE TRANSDUCER

[75] Inventors: Anthony D. Kurtz, Englewood; Donald Weinstein, Fair Lawn, both of N.J.

[73] Assignee: Kulite Semiconductor Products, Ridgefield, N.J.

[21] Appl. No.: 356,084

[22] Filed: Mar. 8, 1982

[51] Int. Cl.³ .................. G01L 9/06; G01R 17/10
[52] U.S. Cl. ................................. 323/280; 73/721; 73/727; 73/862.63; 73/862.67; 323/367
[58] Field of Search .................. 323/364–368, 323/369, 268–269, 274, 289–280; 324/65 R, DIG. 1; 338/4, 36, 42; 73/719–721, 725–727, 861.48, 861.51, 862.63, 862.67

[56] References Cited

U.S. PATENT DOCUMENTS

| | | | |
|---|---|---|---|
| 2,771,579 | 11/1956 | Ruge | 323/365 X |
| 3,034,346 | 5/1962 | Starr | 73/862.67 X |
| 3,568,044 | 3/1971 | Elazar | 323/367 |
| 3,743,926 | 7/1973 | Yerman | 323/367 |
| 4,001,669 | 1/1977 | Preuss | 323/367 |
| 4,362,060 | 12/1982 | Okayama et al. | 73/721 X |

*Primary Examiner*—Peter S. Wong
*Attorney, Agent, or Firm*—Arthur L. Plevy

[57] ABSTRACT

A circuit for linearizing the output of a differential pressure transducer includes first and second operational amplifiers. Each amplifier is associated with threshold devices as diodes so that one amplifier will be active for one condition of output polarity while the other amplifier will be active for the other condition of output polarity. The output of the amplifiers are connected to a common terminal which provides a compensating biasing voltage to the transducer. The voltage varies in a "V" shaped characteristic to enable one to achieve a linear output voltage from the transducer for both positive and negative pressure differences.

10 Claims, 4 Drawing Figures

LINEARIZING CIRCUITS FOR A SEMICONDUCTOR PRESSURE TRANSDUCER

BACKGROUND OF THE INVENTION

This invention relates to transducers in general and more particularly to a circuit which compensates for nonlinearity in a transducer arrangement.

The prior art is replete with a number of circuits which operate to linearize the output of a transducer. Essentially, transducers such as piezoresistive devices will exhibit a varying output voltage upon application to such a device of a varying pressure or force. In regard to transducers in general it is desirable that the output voltage be linearly related to the applied pressure or force and thus exhibit a straight line characteristic.

In practice such devices do not exhibit a straight line characteristic but are nonlinear and for example, the output voltage for a certain range of pressures does not follow the same slope as for a lower range of voltages. This results in a nonlinear transfer characteristic of the transducer.

It is known in the prior art on how to achieve compensation of such a device. Thus the prior art has many examples of circuits which will increase the voltage applied to the transducer as the pressure increases. In this way the nonlinearity is compensated for. However, there is a problem associated with a differential pressure transducer which cannot be accomodated by the prior art techniques.

In a differential pressure transducer there is provided a positive and negative output for a range of differential pressures which are applied to the transducer. For example, a differential transducer provides the output voltage which is the differance between first and second input pressures. As one can ascertain, a first input pressure designated as $P_1$ and a second input pressure designated as $P_2$ are compared in a differential transducer and an output voltage is obtained which is a difference between $P_1$ and $P_2$. Hence if $P_1$ is greater than $P_2$, the output voltage will be positive. If $P_2$ is greater than $P_1$, the output voltage will be negative.

In such a device the transfer characteristic is such that by applying the prior art techniques one often may not be able to compensate in both the positive and negative directions. Such a situation occurs when the linearity of the device shows a characteristic as given by following equation:

$$V = k_1 F \pm k_2 F^2$$

where

V is the output voltage

F is the applied force or other variable $k_1$ and $k_2$ are the sensitivity constant of the particular transducer.

Such a characteristic is very typical of transducers.

In using conventional techniques one will improve the linearity for one polarity output but the same circuit will degrade the linearity for the opposite polarity output. Thus in a differential transducer the circuit which provides linearity in one direction actually degrades or worstens the results in an opposite direction.

Differential pressure transducers are well-known in the field and basically have two inputs for receiving the input pressures as $P_1$ and $P_2$ and an output which provides a voltage proportional to the difference between the input pressures.

In the fabrication of the differential pressure transducer utilizing semiconductor technique it is known that the transfer function of the device is nonlinear and due to the fact that differential pressure is being monitored, linearity cannot be improved or compensated for by using conventional techniques.

It is therefore an object of the present invention to provide apparatus for linearizing the output of a differential pressure transducer.

BRIEF DESCRIPTION OF THE PREFERRED EMBODIMENT

A linearizing circuit apparatus for a differential transducer of the type employing a conventional Wheatstone bridge array having first and second input terminals for applying a source of bieasing potential therebetween and first and second output terminals for obtaining a transducer output voltage therebetween, with said transducer undesirably providing a non-linear output voltage for both a positive and a negative voltage difference between said output terminals, said linearizing circuit apparatus operative to linearize said output voltage for both said positive and negative voltage differences comprising first and second amplifiers each having a non-inverting and an inverting input terminal and an output terminal, with the non-inverting input terminal of said first amplifier coupled to said first output terminal of said bridge, and the non-inverting input terminal of said second amplifier coupled to said second output terminal of said bridge, input means coupling said inverting input terminals of said first and second amplifiers together, first threshold means coupled between the output terminal and the inverting input terminal of said first amplifier and second threshold means coupled between the output terminal and the inverting input terminal of said second amplifier feedback means coupling said output terminals of said first and second amplifiers to said input means, to cause said first amplifier to operate when said voltage at said first bridge terminal exceeds the voltage at said second bridge terminal with said second threshold means operative to bypass said second amplifier, and to cause said second amplifier to operate when said voltage at said second bridge terminal exceeds the voltage at said first bridge terminal with said first threshold means operative to bypass said first amplifier and means for coupling the output terminals of said first and second amplifiers to one of said input terminals of said bridge array.

DETAILED DESCRIPTION OF THE INVENTION

Figure 1:
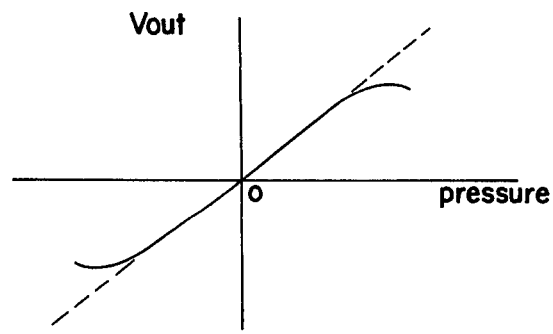
FIG. 1 is a graph of pressure v. voltage depicting the transfer characteristic of a typical uncompensated differential pressure transducer.

Referring to FIG. 1, there is shown a graph of pressure v. voltage ouput from a differential pressure transducer. As one can see from FIG. 1, the transfer function is essentially nonlinear. Thus for positive increasing pressures the curve deviates from the straight line value. For negative pressure differences the curve also deviates and generally has the appearance of an "S" shaped curve. This is a typical characteristic for many semiconductor and strain gage pressure, force or acceleration transducers. In order to achieve a linear relationship as depicted by the dashed line, the circuit shown in FIG. 2 is employed.

Figure 2:
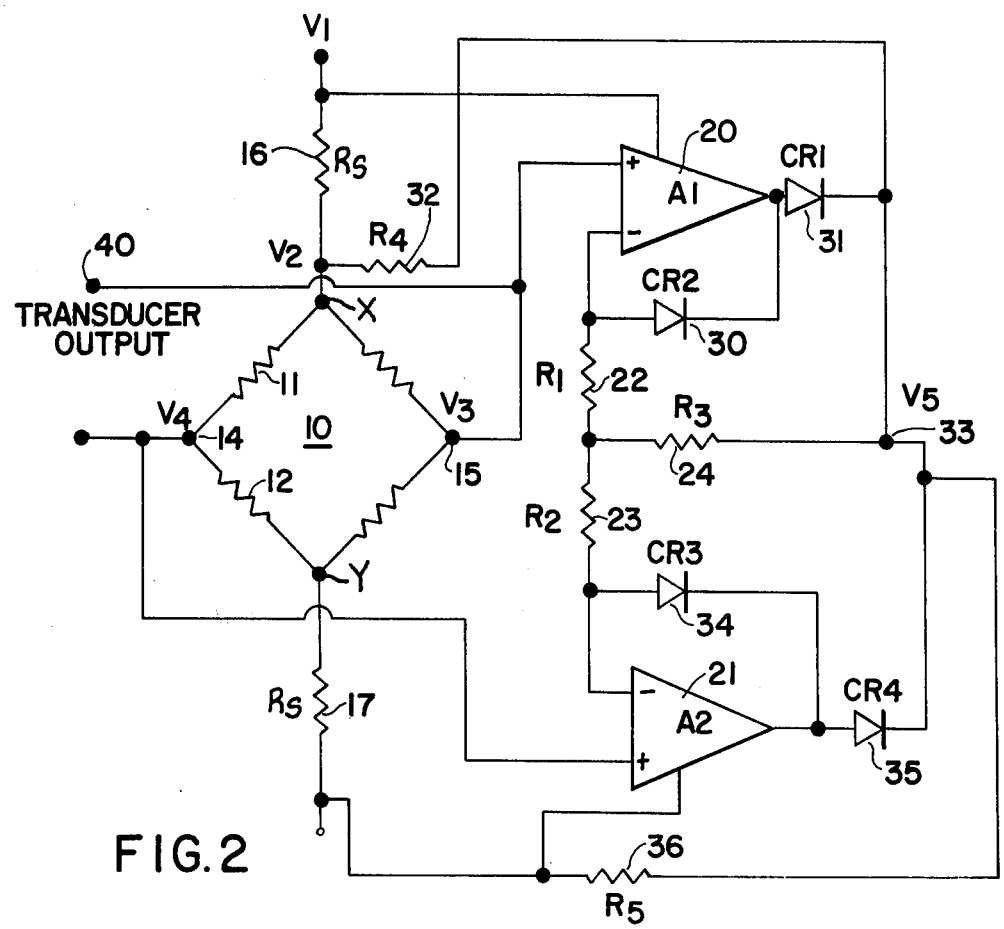
FIG. 2 is a detailed schematic circuit of a linearizing circuit according to this invention.

In FIG. 2, reference numeral 10 defines a Wheatstone bridge. The bridge 10 may consists of two or more piezoresistors as 11 and 12 arranged in a differential transducer structure to respond to two input pressures and to provide an output which is proportional to the difference between the two input pressures. In a conventional array the output voltage is taken between terminals 14 and 15 designated as $V_3$ and $V_4$. The bridge 10 is biased from a voltage source $V_1$ via a current limiting resistor 16 applied to terminal X of the bridge. The corresponding terminal designated as Y is returned to a point of reference potential via a resistor 17.

FIG. 2 shows two operational amplifiers 20 and 21. Each amplifier has a non-inverting input (+) and an inverting input (−). Examples of suitable operational amplifiers are well-known in the art. Essentially, an operational amplifier is a high gain device and many suitable amplifiers are available commercially. The operating characteristics of such amplifiers as 20 and 21 are well understood. Amplifier 20 ($A_1$) has its non-inverting input coupled to terminal 15 of the bridge 10. The amplifier 20 receives its operating bias from the potential source $V_1$. Coupled to the inverting input of amplifier 20 is a resistor 22 also designated as $R_1$. Resistor 22 is in series with a resistor 23 which has one terminal connected to the inverting input of amplifier 21. The junction between resistors 22 and 23 is connected to one terminal of a resistor 24 designated as $R_3$. Both operational amplifiers 20 and 21 have a diode connected between the output and the inverting input. Thus amplifier 20 has the anode of diode 30 connected to the inverting terminal with the cathode of diode 30 connected to the output. A further diode 31 has its anode connected to the output of amplifier 20 with its cathode connected through the resistor 32 to the X terminal of the bridge 10. The cathode of diode 31 is also connected to the other terminal 33 of resistor 24. In a similar manner amplifier 21 is associated with a diode 34. The anode of diode 34 is connected to the inverting input of amplifier 21 while the cathode is connected to the output. A diode 35 has its anode connected to the output of amplifier 21 and the cathode connected to terminal 33. A resistor 36 is connected between terminal 33 and the biasing input of amplifier 21, which input is coupled to the point of reference potential associated with the bridge circuit 10.

In conjunction with the above amplifier arrangement, the output of the circuit is taken between terminal 40 and terminal 14. Terminal 40 as seen from FIG. 2 is connected to the non-inverting input of amplifier 20. The bridge circuit 10 which is part of a differential pressure transducer has the transfer characteristic as depicted in FIG. 1. The circuit shown in FIG. 2 operates to increase the voltage applied at terminal X of the bridge as the output voltage between terminals 14 and 15 increases. The voltage applied to terminal X which is $V_2$ will increase as $V_3-V_4$ increases in the positive or negative direction. This is shown in FIG. 3 where the voltage $V_2$ is shown as a function of pressure.

Figure 3:
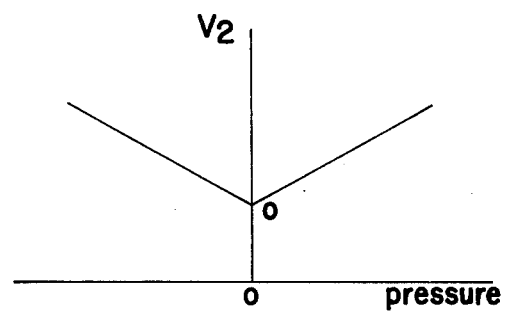
FIG. 3 is a graph depicting voltage applied to a transducer based on the operation of the circuit of FIG. 2.

Thus as shown in FIG. 3, the circuit described above has a "V" shaped transfer function. The operation of the circuit is as follows: When voltage $V_3$ is more positive than voltage $V_4$, the output of amplifier 20 will be more positive than the output of amplifier 21. Accordingly, diodes 31 and 34 will conduct and hence be forward biased, while diodes 30 and 35 will be reversed biased. Thus when diode 34 is conducting it bypasses amplifier 21 which will not operate to amplify based on the low impedance path of diode 34. When the voltage at terminal 14 is greater than the voltage at terminal 15, diode 35 and diode 30 conduct and therefore amplifier 20 is bypassed. The voltage at the output of amplifier 21 will be lower than the voltage $V_4$ at terminal 14 by the voltage drop across the diode 34. The voltage at terminal 33 which is $V_5$ is given by the following equation:

$$V_5 = V_3 + \frac{R_3(V_3 - V_4)}{R_2} \tag{1}$$

The resistor 35 or $R_4$ is used to provide some isolation and attenuation between the voltage at terminal 33 ($V_5$) and the voltage at terminal X ($V_2$). The resistor 36 provides a current path for the circuit when $V_5$ is less than $V_2$. In regard to the circuit operation when the voltage $V_4$ at terminal 14 is greater than voltage $V_3$ at terminal 15, the output voltage $V_5$ is given by the following equation:

$$V_5 = V_4 + \frac{R_3(V_4 - V_3)}{R_1} \tag{2}$$

As one can see from equations 1 and 2, the voltage $V_5$ for a positive output is independent of the voltage $V_5$ for a negative output. In this manner the voltage $V_2$ is a function of the voltage $V_5$ and can be made linear to remove the nonlinearity associated with the bridge array. It is noted from equations 1 and 2 that the value of resistors $R_1$ and $R_2$ determine the amount of feedback voltage applied to terminal X as they determine the output voltage $V_5$ at terminal 33. In this manner one can compensate for different nonlinearities as shown in FIG. 1 in both the positive and negative directions.

Figure 4:
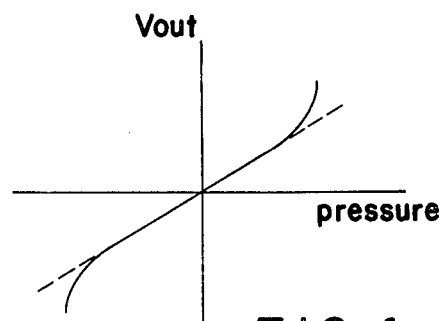
FIG. 4 is a graph of pressure v. voltage output of transfer function of another type in which the circuit of FIG. 2 can be employed to achieve linearity.

In FIG. 4, there is shown a transfer characteristic of a sensor having a nonlinearity in the opposite direction of that shown in FIG. 1. When a transducer has the characteristic as shown in FIG. 4, it can be linearized by connecting resistor 35 to terminal Y instead of terminal X. In this manner as the output voltage of the transducer increases the voltage at terminal 33 will increase causing the voltage at terminal Y to increase and hence causing a decrease in voltage across the bridge 10.

Thus the above circuit is completely effective in providing a linear output for a differential pressure transducer having a characteristic shown in FIGS. 1 or 4. The operational amplifiers described above may be the type designated as LM358D which are available from many manufactures. While the circuit has particular utility in linearizing a differential pressure transducer employing piesoresistive elements, it is applicable and useful in linearizing the output of any differential transducer (pressure, force or other) having the transfer characteristic as shown in FIGS. 1 and 4.

MATHEMATICAL ANALYSIS

To analyze the linearization compensation of a pressure transducer, the bridge output voltage is represented as follows:

$$V(p) = V_B U(p) \tag{1}$$

where $V_B$ is the bridge excitation voltage and $U(p)$ is the fractional unbalance (sensitivity in mv/v) of the bridge in response to an applied pressure p. For an ideal transducer the sensitivity is exactly linear, i.e.

$$U(p) = U_m \frac{p}{P_m} = U_m \psi \tag{2}$$

Here $U_m$ is the full scale sensitivity at the full scale (F.S.) pressure $P_m$. For a real transducer in which diaphragm stretching effects introduce monotonic nonlinearities in the form of quadratic pressure terms, we have typically:

$$U(\omega) = U_m[x + 4\alpha\psi(1-\psi)] \tag{3}$$

The nonlinearity parameter represents the maximum fractional departure (in % FS) of the sensitivity at the half scale pressure ($\psi = \frac{1}{2}$) from the end point line. If the bridge voltage $V_B$ can be made to increase uniformly with pressure, then the output $V(p)$ can be compensated for the decrease in sensitivity with pressure when and is positive.

An analysis of the linearizing feedback circuit of FIG. 2 results in the following expression for the bridge excitation voltage $V_B$ between terminals (X) and (Y) namely:

$$V_B = \frac{V_{BO}}{1 - B\frac{U(\psi)}{U_m}} \tag{4}$$

$$\text{where } V_{BO} = \frac{V_1 R_B (2R_4 + R_s)}{2[R_4(R_B + 2R_s) + R_s(R_s + R_B)]} \tag{5}$$

$$B = \frac{R_s R_B (1 + 2R_3/R_2) U_m}{2[R_4(R_B + 2R_s) + R_s(R_s + R_B)]} \tag{6}$$

where $R_s$ = span resistor values CR (16 & 17 of FIG. 2). This is the desired result, that $V_B$ increase with pressure. $R_B$ in equation (5) is the bridge input resistance measured between terminals (X) and (Y). Note that when the resistance $R_4$ is open (infinite), the correction parameter B becomes zero combining equations (1), (3) and (4), we have:

$$V(\psi) = \frac{V_m \psi \left[1 \left(\frac{4\alpha}{1+4\alpha}\right) \psi\right]}{1 - B(1 + 4\alpha)\psi + 4\alpha B\psi^2} \tag{7}$$

and $$V_m = V_{BO} U_m (1 + 4\alpha) \tag{8}$$

If the quadratic term in the denominator of equation (7) were ignored, then a perfect compensation of the non-linearity could be achieved by choosing:

$$B = \frac{4\alpha}{(1 + 4\alpha)^2} \tag{9}$$

Since parameters $R_B$, $R_s$, $U_m$ and $\alpha$ are characteristic of a particular transducer, we can fix the op-amp circuit resistors $R_1$, $R_2$, and $R_3$ and select the feedback control resistor $R_4$ using equation (6) and condition (9):

$$R_4 = \frac{R_s R_B \left(1 + 2\frac{R_3}{R_2}\right) \frac{U_m}{2B} - R_s(R_s + R_B)}{2R_s + R_B} \tag{10}$$

As an illustration, let $R_B = 1.0$ kΩ, $R_s = 2.0$ kΩ, $R_3 = 50.0$ kΩ, $R_2 = 1.0$ kΩ and $U_m = 20$ mv/v $= 0.02$. For a transducer having 2% FS end point linearity, $\alpha = 0.2$ and $B = 0.0686$. Equation (10) gives $R_4 = 5.3$ kΩ. A further analysis of equation (7) with condition (9) imposed indicates a residual end point nonlinearity of 0.23% FS when $R_4 = 5.3$ kΩ is used.

We claim:
1. A linearizing circuit apparatus for a differential transducer of the type employing a conventional Wheatstone bridge array having first and second input terminals for applying a source of biasing potential therebetween and first and second output terminals for obtaining a transducer output voltage therebetween, with said transducer undesirably providing a non-linear output voltage for both a positive and a negative voltage difference between said output terminals, said linearizing circuit apparatus operative to linearize said output voltage for both said positive and negative voltage differences comprising:
   (a) first and second amplifiers each having a non-inverting and an inverting input terminal and an output terminal, with the non-inverting input terminal of said first amplifier coupled to said first output terminal of said bridge, and the non-inverting input terminal of said second amplifier coupled to said second output terminal of said bridge;
   (b) input means coupling said inverting input terminals of said first and second amplifiers together;
   (c) first threshold means coupled between the output terminal and the inverting input terminal of said first amplifier and second threshold means coupled between the output terminal and the inverting input terminal of said second amplifier;
   (d) feedback means coupling said output terminals to said input means, to cause said first amplifier to operate when said voltage at said first bridge output terminal exceeds the voltage at said second bridge output terminal with said second threshold means operative to bypass said second amplifier, and to cause said second amplifier to operate when said voltage at said second bridge output terminal exceeds the voltage at said first bridge output terminal with said first threshold means operative to bypass said first amplifier and means for coupling the output terminals of said first and second amplifiers to one of said input terminals of said bridge array.

2. The linearizing circuit apparatus according to claim 1, wherein said first and second amplifiers are operational amplifiers.

3. The linearizing circuit apparatus according to claim 2, wherein said input means coupling said inverting input terminals of said first and second amplifiers together includes first and second resistors in a series path between said inverting terminals.

4. The linearizing circuit apparatus according to claim 3 wherein said first threshold means includes a first diode having the anode connected to said inverting terminal of said first amplifier and the cathode connected to said output terminal of said first amplifier, and said second threshold means includes a second diode having the anode connected to said inverting terminals of said second amplifier and the cathode connected to said output terminal of said second amplifier.

5. The linearizing circuit apparatus according to claim 4 further including a third diode having its anode connected to the output of said first amplifier, and a fourth diode having its anode connected to the output of said second amplifier with the cathodes of said third and fourth diodes connected together.

6. The linearizing circuit apparatus according to claim 5, wherein said feedback means includes a resistive impedance having one terminal connected to the cathodes of said third and fourth diodes and one terminal connected to the common junction between said first and second resistors.

7. The linearizing circuit apparatus according to claim 6, wherein said means for coupling the output terminals of said first and second amplifiers includes a resistor having one terminal coupled to the cathodes of said third and fourth diodes and one terminal coupled to one of said bridge input terminals.

8. The linearizing circuit apparatus according to claim 7, further including a resistor coupled between the cathodes of said third and fourth diodes and a point of reference potential.

9. The linearizing circuit apparatus according to claim 1 wherein said differential transducer is a differential pressure transducer.

10. The linearizing circuit apparatus according to claim 9, wherein said differential pressure transducer is of the type employing semiconductor piezoresistors in said Wheatstone bridge array.

* * * * *